US006881260B2

(12) United States Patent
Marsh et al.

(10) Patent No.: US 6,881,260 B2
(45) Date of Patent: Apr. 19, 2005

(54) PROCESS FOR DIRECT DEPOSITION OF ALD RHO2

(75) Inventors: Eugene P. Marsh, Boise, ID (US); Stefan Uhlenbrock, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/179,946

(22) Filed: Jun. 25, 2002

(65) Prior Publication Data

US 2003/0233976 A1 Dec. 25, 2003

(51) Int. Cl.$^7$ ............................................. C30B 25/02
(52) U.S. Cl. ...................... 117/89; 117/101; 117/104; 117/105
(58) Field of Search ....................... 117/89, 101, 104, 117/105

(56) References Cited

U.S. PATENT DOCUMENTS

| | | | |
|---|---|---|---|
| 5,096,737 A | | 3/1992 | Baum et al. |
| 5,149,596 A | | 9/1992 | Smith et al. |
| 5,220,044 A | | 6/1993 | Baum et al. |
| 5,696,384 A | | 12/1997 | Ogi et al. |
| 5,990,559 A | | 11/1999 | Marsh |
| 6,271,131 B1 | | 8/2001 | Uhlenbrock et al. |
| 6,319,832 B1 | * | 11/2001 | Uhlenbrock et al. ......... 438/681 |
| 6,482,740 B1 | * | 11/2002 | Soininen et al. ............ 438/686 |
| 2001/0031539 A1 | * | 10/2001 | Uhlenbrock et al. ......... 438/381 |
| 2002/0055242 A1 | * | 5/2002 | Uhlenbrock et al. ......... 438/584 |
| 2002/0197814 A1 | | 12/2002 | Marsh et al. |
| 2003/0054606 A1 | | 3/2003 | Marsh et al. |

OTHER PUBLICATIONS

Khakani et al., "Pulsed laser deposition of highly conductive iridium oxide thin films," Appl. Phys. Lett., 69, 2027–2029 (1991).

Bhatt et al., "Novel high temperature multilayer electrode–barrier structure for high–density ferroelectric memories," Appl. Phys. Lett., 71, 719–721 (1997).

Cohan et al., "Laser–assisted organometallic chemical vapor deposition of films of rhodium and iridium," Appl. Phys. Lett., 60, 1402–1403 (1992).

Doppelt et al., "Mineral precursor for chemical vapor deposition of Rh metallic films," Mater. Sci. Eng., B17, 143–146 (1993).

Etspuler et al., "Deposition of Thin Rhodium Films by Plasma–Enhanced Chemical Vapor Deposition," Appl. Phys. A 48, 373–375 (1989).

Kaesz et al., "Low–Temperature Organometallic Chemical Vapor Deposition of Transition Metals," Mat. Res. Soc. Symp. Proc., 131, 395–400 (1989).

Kumar et al., "New precursors for organometallic chemical vapor deposition of rhodium," Can. J. Chem., 69, 108–110 (1991).

Smith et al., "Low–Temperature Chemical Vapor Deposition of Rhodium and Iridium Thin Films," Mat. Res. Soc. Symp. Proc., 168, 369–374 (1990).

* cited by examiner

Primary Examiner—Robert Kunemund
(74) Attorney, Agent, or Firm—Dickstein Shapiro Morin & Oshinsky LLP

(57) ABSTRACT

The present invention provides methods of performing atomic layer deposition to form conductive, oxidation-resistant rhodium oxide films and films comprising metals, such as platinum, alloyed with rhodium oxide. The present invention also provides memory devices and processors comprising films deposited by the above methods.

80 Claims, 8 Drawing Sheets

PROCESS FOR DIRECT DEPOSITION OF ALD RHO2

FIELD OF THE INVENTION

The present invention relates generally to the field of semiconductor integrated circuits and, more particularly, to processes for forming thin films for use in such applications.

BACKGROUND OF THE INVENTION

Thin film technology in the semiconductor industry requires thin deposition layers, increased step coverage and conformality, large production yields, and high productivity, as well as sophisticated technology and equipment for coating substrates used in the fabrication of various devices. For example, process control and uniform film deposition directly affect packing densities for memories that are available on a single chip or device. Thus, the decreasing dimensions of devices and the increasing density of integration in microelectronics circuits require greater uniformity and process control with respect to layer thickness.

Moreover, numerous applications, including electrodes for high dielectric capacitors, require highly conductive, oxidation-resistant films.

Various methods for depositing thin films of complex compounds, such as metal oxides, ferroelectrics or superconductors, are known in the art. Current technologies include physical vapor deposition (PVD), RF sputtering, spin coating processes, and chemical vapor deposition (CVD), with its well-known variation called rapid thermal chemical vapor deposition (RTCVD). These technologies, however, have some disadvantages. For example, the RF sputtering process yields poor conformality, while the spin deposition of thin films is a complex process, which generally involves two steps: an initial step of spinning a stabilized liquid source on a substrate usually performed in an open environment, which undesirably allows the liquid to absorb impurities and moisture from the environment; and a second drying step, during which evaporation of organic precursors from the liquid may leave damaging pores or holes in the thin film. Further, both CVD and RTCVD are flux-dependent processes requiring uniform substrate temperatures and uniform distribution of the chemical species in the process chamber.

Atomic Layer Deposition (ALD) is also a technique used to deposit various types of thin films, including metal and dielectric films. The ALD process is a technique in which deposition can be achieved one atomic elemental layer at a time. ALD offers numerous advantages over other methods, including low impurities content, low processing temperatures, ultra thin film deposition, excellent conformality, and superior thickness uniformity over large substrate areas. Moreover, ALD films make excellent barrier layers.

Many metal layers of Group VIII elements, such as platinum (Pt), palladium (Pd), iridium (Ir), ruthenium (Ru), rhodium (Rh) and osmium (Os) have suitable properties for various uses in integrated circuits, including as electrical contacts. Such layers are also suitable for use as barrier layers between the dielectric material and the silicon substrate in memory devices, such as ferroelectric memories, and even as the plate (i.e., electrode) itself in capacitors. In some applications, such as DRAM circuits, the electrodes in the cell capacitor must protect the dielectric layer from interaction with surrounding materials, including interlayer dielectrics, and from the harsh thermal processing encountered in subsequent processing steps. Moreover, in order to function well as a bottom electrode, the electrode layer or layer stack must act as an effective barrier against oxygen and silicon diffusion. Oxidation of the underlying silicon will result in decreased series capacitance, thus degrading the cell capacitor. Oxidation also results in volume expansion which can lead to stress of parts.

There is thus a need for a thin film layer which overcomes or mitigates the above disadvantages. In particular, a highly conductive thin film is needed which has excellent diffusion barrier qualities, which is resistant to further oxidation and which can be deposited in a process which yields good conformality.

SUMMARY OF THE INVENTION

The present invention provides methods of conducting atomic layer deposition to form conductive, oxidation-resistant rhodium oxide layers having good conformality over substrates and integrated circuit material layers. The present invention also provides methods of conducting atomic layer deposition to form layers comprising metals, such as platinum, alloyed with rhodium oxide.

Methods of the present invention comprise introducing a rhodium group metal precursor into a deposition apparatus under conditions permitting the formation of a rhodium organo metallic monolayer and introducing a reaction gas to oxidize the monolayer to a rhodium oxide. In a preferred embodiment, ozone is used as the reaction gas. The use of ozone as the reaction gas in the process has been surprisingly found to yield a conductive $RhO_2$ oxide as opposed to the nonconductive $Rh_2O_3$.

Layers formed by the methods of the present invention are useful in numerous applications, including as electrodes in high dielectric capacitors. They also provide good barrier layers in these applications.

The present invention also provides capacitors, memory devices, and processor systems which include layers formed according to the methods of the present invention.

These and other features and advantages of the invention will be more clearly understood from the following detailed description, which is provided with reference to the accompanying drawings.

DETAILED DESCRIPTION OF THE INVENTION

Figure 1:
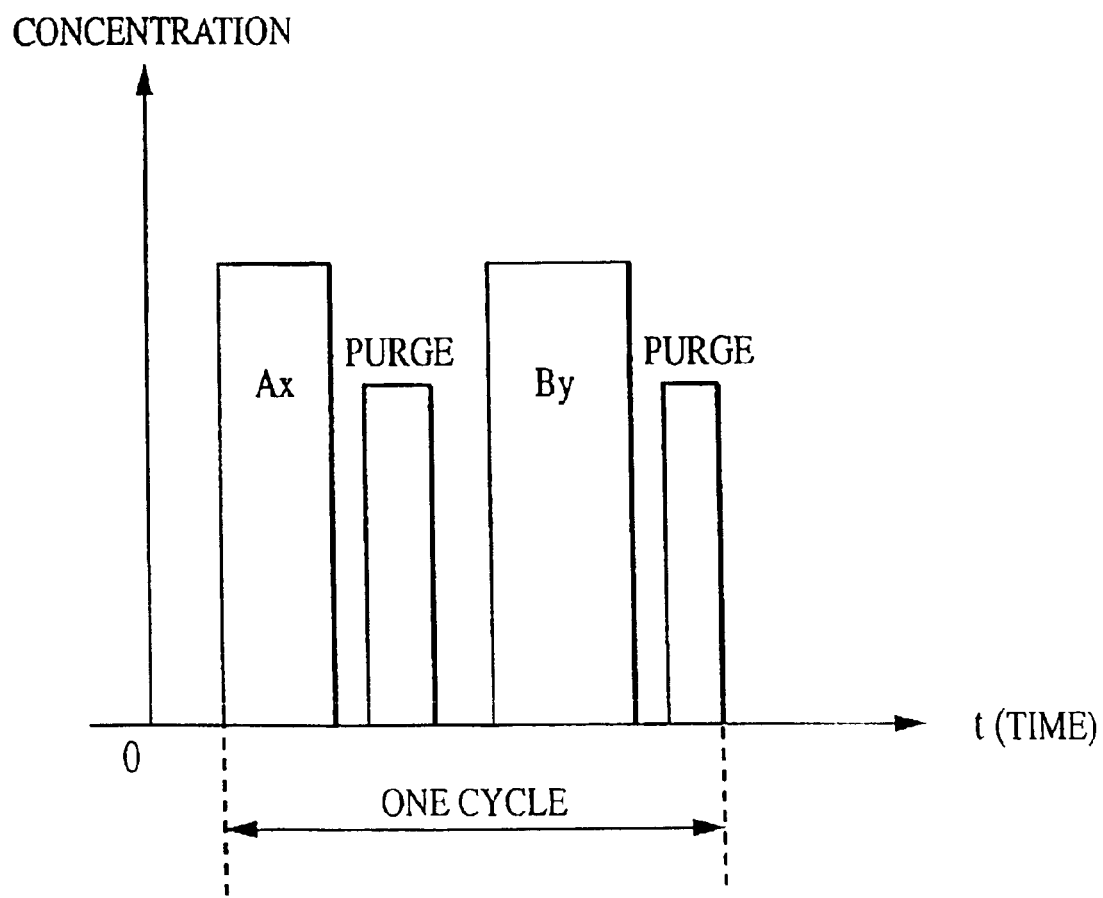
FIG. 1 is a conventional time diagram for atomic layer deposition gas pulsing.

In the following detailed description, reference is made to various specific embodiments in which the invention may be practiced. These embodiments are described with sufficient detail to enable those skilled in the art to practice the invention, and it is to be understood that other embodiments may be employed, and that structural, logical, and electrical changes may be made without departing from the spirit or scope of the present invention.

The terms "substrate" and "wafer" are used interchangeably in the following description and may include any semiconductor-based structure. The structure should be understood to include silicon, silicon-on-insulator (SOI), silicon-on-sapphire (SOS), doped and undoped semiconductors, epitaxial layers of silicon supported by a base semiconductor foundation, and other semiconductor structures. The semiconductor need not be silicon-based. The semiconductor could be silicon-germanium, germanium, or gallium arsenide. When reference is made to the substrate in the following description, previous process steps may have been utilized to form regions or junctions in or over the base semiconductor or foundation.

The term "metal" is intended to include not only elemental metal, but metal with other trace metals or in various alloyed combinations with other metals as known in the semiconductor art, as long as such alloy retains the physical and chemical properties of the metal.

No particular order is required for the method steps described below, with the exception of those logically requiring the results of prior steps. Accordingly, while many of the steps discussed below are discussed as being performed in an exemplary order, this order may be altered.

The present invention provides a method for the formation of highly conductive, low carbon rhodium oxide films which are resistant to oxidation, have good barrier qualities and provide good conformality when deposited. The invention also provides oxide films in which rhodium is alloyed with one or more other metals, such as platinum. Film layers of the present invention can be used in numerous applications, including as top and/or lower plate electrodes for capacitors, as fuse elements or as seed layers for electroplating. According to an exemplary embodiment of the invention, rhodium oxide films are formed by a low temperature atomic layer deposition technique using a precursor of $(C_5H_5)Rh(CO_2)$ with ozone as a reaction gas.

Continuous and smooth films formed according to embodiments of the present invention employ atomic layer deposition (ALD) processes. ALD is known in the art and is described below.

Generally, the ALD technique proceeds by chemisorption at the deposition surface of the substrate. The ALD process is based on a unique mechanism for film formation, which includes the formation of a saturated monolayer of reactive precursor molecules by chemisorption, in which reactive precursors are alternately pulsed into a deposition chamber. Each injection of a reactive precursor is separated by an inert gas purge or a pump cycle. Each injection also provides a new atomic layer on top of the previously deposited layers to form a uniform layer of solid film. This cycle is repeated until the desired film thickness is achieved.

This unique ALD mechanism for film formation has several advantages over the other current technology mentioned above. First, because of the flux-independent nature of ALD, the design of the reactor can be simple. The thickness of the deposited layer is independent of the amount of precursor delivered after the formation of the saturated monolayer. Second, interaction and high reactivity of precursor gases in the gas phase above the wafer is avoided because chemical species are introduced independently, rather than together, into the reactor chamber. Third, ALD allows almost a perfect step coverage over complex topography as a result of the self-limiting surface reaction.

Referring to the drawings, where like elements are designated by like reference numerals, FIG. 1 illustrates one complete cycle in the formation of an AB solid material by a typical atomic layer deposition (ALD) process. A first species Ax is deposited over an initial surface of a substrate as a first monolayer. A second species By is next applied over the Ax monolayer. The By species reacts with Ax to form compound AB. The Ax, By layers are provided on the substrate surface by first pulsing the first species (a first precursor gas) Ax and then the second species (a second precursor gas) By into the region of the surface. If thicker material layers are desired, the sequence of depositing Ax and By layers can be repeated as often as needed until a desired thickness is reached. Between each of the precursor gas pulses, the process region is purged with an inert gas or evacuated.

As illustrated in FIG. 1, a first pulse of precursor Ax is initially generated and followed by a transition time in which no gas is inputted. Subsequently, an intermediate pulse of a purge gas takes place, followed by another transition time. Precursor gas By is then pulsed, another transition time follows, and then a purge gas is pulsed again. Thus, in a typical ALD process, a complete cycle incorporates one pulse of precursor Ax and one pulse of precursor By, each precursor pulse being separated by a purge gas pulse.

Figure 2:
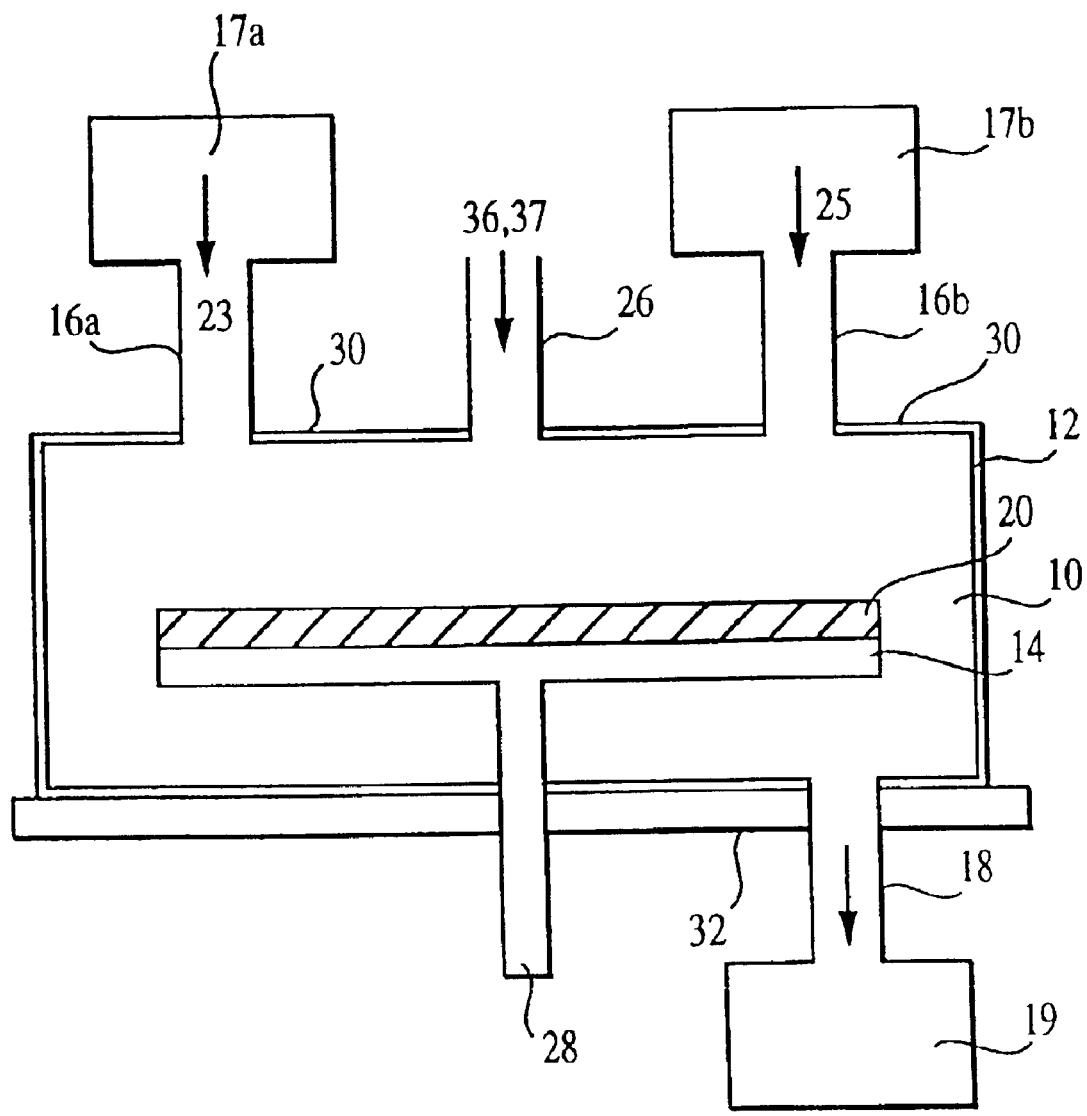
FIG. 2 is an elevation view of an atomic layer deposition (ALD) apparatus useful in the formation of a film layer according to the present invention.

The cycle described above for the formation of an AB solid material by atomic layer deposition can be employed in the formation of a film in a deposition apparatus such as that illustrated in FIG. 2. Such an apparatus may include a reactor chamber 10, which may be constructed as a quartz container, and a susceptor 14 which can hold one or a plurality of semiconductor substrates 20 (as illustrated), and which is mounted on the upper end of a shaft 28. The susceptor is also referred to herein as the deposition region. Mounted on one of the chamber defining walls, for example on upper wall 30 of the reactor chamber 10, are reactive gas supply inlets 16a and 16b, which are further connected with reactive gas supply sources 17a and 17b which supply first and second gas precursors, respectively. An exhaust outlet 18, connected to an exhaust system 19, is situated on an opposite lower wall 32 of the reactor chamber 10. A purge gas inlet 26, connected to a purge gas system (not shown), is also provided on the upper wall 30 and positioned between the reactive gas supply inlets 16a and 16b in the illustrated apparatus.

According to an embodiment of the present invention, a first reactive gas precursor 23 is introduced into the reactor chamber 10 through the reactive gas inlet 16a. The first reactive gas precursor 23 flows at a right angle to the semiconductor substrate 20 and reacts with its surface portion to form a monolayer. The first reactive gas precursor 23 may be any suitable organic compound which allows rhodium or an alternate desired metal to deposit from the gas onto the surface of the semiconductor substrate 20. Thus, the precursor may be, for example, an organic rhodium (I) group metal precursor having at least one rhodium source com pound selected from the group consisting of compounds of the formula (1):

$$Ly[Rh]Yz \tag{1}$$

wherein:

L is independently selected from the group consisting of neutral and anionic ligands;

y is one of {1, 2, 3, 4} and more preferably 1;

Y is independently a pi-orbital bonding ligand selected from the group consisting of CO, NO, CN, CS, $N_2$, $PX_3$, $PR_3$, $P(OR)_3$, $AsX_3$, $AsR_3$, $As(OR)_3$, $SbX_3$, $SbR_3$, $Sb(OR)_3$, $NH_xR_{3-x}$, CNR, and RCN, wherein R is an organic group, X is a halide and x is one of {0, 1, 2, 3}; and z is one of {0, 1, 2, 3, 4}, preferably one of {1, 2, 3, 4}, more preferably one of {2, 3} and most preferably 2.

Thus, and in accordance with formula (1) outlined above, the first reactive gas precursor 23 of an organic rhodium group metal precursor may include, for example, rhodium beta-diketonates, rhodium acetylacetonate, alkyl rhodium dienes, or compounds including a carbon ring, for example, rhodium cyclopentadienyl derivatives such as dicarbonyl cyclopentadienyl rhodium [$CpRh(CO)_2$], among many others.

In an exemplary embodiment, vapors of dicarbonyl cyclopentadienyl rhodium [$CpRh(CO)_2$] are used as the first pulse of precursor 23 at a temperature of about 100° C. to about 200° C., more preferably of about 100° C. to about 150° C., at a rate of about 0.1 to 500 standard cubic centimeters per minute ("sccm"), more preferably of about 0.1 to 5 sccm, and for a duration of about 0.1 second to about 30 seconds, more preferably of about 0.2 second to about 10 seconds.

Although the precise reactions for the atomic layer deposition of rhodium are not known in the art, it is believed that organo-metallic rhodium precursor molecules chemisorb to the semiconductor substrate 20 forming an organo-rhodium monolayer. The surface is dosed long enough to ensure surface saturation. Thus, the organo-metallic rhodium precursor molecules attach to the initial surface of the semiconductor substrate 20 to form a complete and saturated organo-rhodium monolayer. Any excess rhodium gas precursor 23 remaining in the reactor chamber 10 is then removed by either purging or evacuating the reactor chamber 10.

In an exemplary embodiment, after the first saturated organo-rhodium monolayer is formed and any of the remaining unreacted gas precursor 23 is completely exhausted through the exhaust inlet 18, a first purge gas 36 is then introduced into the reactor chamber 10 through the inlet 26. Although the present invention will be described with reference to the use of a purge gas, such as the first purge gas 36, it must be understood that the invention also contemplates the complete evacuation of the remaining unreacted gas precursor 23, by using other means, such as, for example, a vacuum pump, and without employing a purge gas.

The first purge gas 36 may be introduced into the reactor chamber 10 after about 1 second following the complete exhaustion of the unreacted rhodium precursor 23, and for a purge duration of about 0.1 second to about 10 seconds. The first purge gas 36 is fed into the reactor chamber 10 at a rate of about 0 to about 1,000 sccm, more preferably of about 10 to 500 sccm, most preferably of about 10 to 200 sccm. The flow rate of the first purge gas 36 into the reactor chamber 10 is determined based on the rhodium group metal to be deposited, as well as on the substrate on which rhodium is deposited and the temperature and pressure at which the atomic layer deposition takes place. Preferable gases for the first purge gas 36 are helium (He), argon (Ar), or nitrogen ($N_2$) among others, with helium most preferred.

The substrate 20, having now had deposited thereon a saturated organo-rhodium monolayer, is then exposed to a second reactive gas precursor 25. The second reactive gas precursor 25 is supplied into the reactor chamber 10 through the reactive gas inlet 16b and also flows at a right angle onto the semiconductor substrate 20 and thus the saturated organo-rhodium monolayer.

The present invention provides an ALD process for forming rhodium oxide film layers as well as metal oxide layers containing alloys of rhodium and platinum or other suitable metal. To form a metal oxide layer, therefore, the second reactive gas precursor 25 is preferably ozone ($O_3$), which is fed into the reactor chamber 10 at a rate of about 1 to 500 sccm, most preferably of about 10 to 200 sccm, and for a duration of about 0.1 second to about 30 seconds, more preferably of about 1 second to about 10 seconds until fully reacted. This reaction is carefully tailored according to the other ALD parameters so that saturation of the available surface sites is reached, and the organic component of the organo-rhodium monolayer is completely converted to a $RhO_2$ film. The flow rate of ozone is also determined based on the rhodium group metal to be deposited, as well as on the substrate on which rhodium is deposited and the temperature and pressure at which the atomic layer deposition takes place.

It should be noted that if oxygen ($O_2$) were used as the second precursor gas the result would be a layer with a pure metallic composition (Rh), as the oxygen would eliminate or facilitate removal of the cyclopentadienyl (Cp) ring of the dicarbonyl cyclopentadienyl rhodium [$CpRh(CO)_2$] gas precursor as well as the removal or the oxidation of carbonyl groups, such as (CO) groups, to ($CO_2$) groups. Thus, the ($CO_2$) groups, the carbon from the deposited saturated organo-rhodium monolayer would be removed and a pure metallic rhodium layer formed on the surface of the substrate 20.

The use of ozone ($O_3$) in the above process, however, surprisingly yields a layer of the highly conductive oxide $RhO_2$, which has a resistivity of less than 100 $\mu\Omega$cm. Ozone also eliminates or facilitates removal of the cyclopentadienyl (Cp) ring of the dicarbonyl cyclopentadienyl rhodium [$CpRh(CO)_2$] gas precursor as well as the removal or the oxidation of carbonyl groups, such as (CO) groups, to ($CO_2$) groups (greatly reducing carbon contamination), but it is surprising that the process yields the conductive oxide, rather than the nonconductive $Rh_2O_3$. The resultant $RhO_2$ layer is advantageous over pure metallic layers because the Rh in the oxide is already fully oxidized and thus resistant to volume expansion induced by subsequent processing, such as oxygen annealing.

Any remaining reactive ozone precursor 25 in the reactive chamber 10 is exhausted through the exhaust inlet 18. An intermediate pulse of a second purge gas 37 is then introduced into the reactor chamber 10 through the inlet 26. The second purge gas 37 may be introduced into the reactor chamber 10 for a purge duration of about 0.1 second to about 10 seconds. The second purge gas 37 is fed into the reactor chamber 10 at a rate of about 0 to about 1,000 sccm, more preferably of about 10 to 500 sccm, most preferably of about 10 to 200 sccm. The flow rate of the second purge gas 37 into the reactor chamber 10 is determined based on rhodium group metal to be deposited, as well as on the substrate on which rhodium is deposited and the temperature and pressure at which the atomic layer deposition takes place. Preferable gases for the second purge gas 37 are helium (He), argon (Ar), or nitrogen ($N_2$) among others, with helium most preferred. As noted above, the invention is not limited to the use of a purge gas, such as the second purge gas 37, and the invention also contemplates the complete evacuation of the reactive oxygen precursor 25 by a means other than employing a purge gas.

As explained above, the cycle could be repeated a number of times, in order to achieve the desired thickness of the deposited rhodium oxide film. Assuming that 1 Angstrom of rhodium oxide film is deposited per one ALD cycle, then the formation of a film with a thickness of about 300 Angstroms, for example, would require about 300 ALD cycles. A preferred thickness is about 100 Angstroms.

The present invention also provides a process of forming a metal oxide layer in which platinum (Pt) or another suitable metal is alloyed with $RhO_2$ to yield, for example, a Pt—$RhO_2$ layer. Platinum is preferred in order to produce a layer with enhanced conductivity and barrier characteristics. Other elements suitable for alloying with rhodium oxide include, without limitation, Os, Pd, and Ir. In a metal oxide forming process in which such an alloy is desired, following introduction of the rhodium group metal precursor, the subsequent purge or evacuation, and ozone introduction, a next purge or evacuation is done. Following this next purge, a Pt containing precursor is introduced, followed by still another purge. This purge is followed by the introduction of ozone or oxygen, either of which is capable of removing or facilitating the removal of organic compound from the Pt precursor. It is possible to use either oxygen or ozone for removal of organic compound from the Pt precursor because Pt does not oxidize, thereby only allowing the oxygen or ozone to remove the organic compound.

As explained above, this cycle could be repeated a number of times, in order to achieve the desired thickness of the deposited alloy film. In addition, this process can be varied to form layers with different relative amounts of $RhO_2$ and Pt, by varying the number of times a rhodium precursor is introduced relative to the number of times a platinum precursor is introduced within the same cycle. To achieve a uniform alloy layer, for example, it is preferable to alternate Pt with rhodium oxide in a 1:1 ratio. However, if a different composition is desired, one may repeat the introduction of one of the precursors several times before introducing the other precursor. Thus, to achieve a film with five times the amount of platinum as rhodium oxide, for example, one may deposit one rhodium oxide layer followed by five cycles of platinum deposition, before a next rhodium oxide layer, then repeating the entire cycle. It must be understood that although this method is described with reference to platinum as a metal for alloying with rhodium oxide, other suitable metals may also be used as described above.

The low temperature atomic layer deposition methods of the present invention are useful for numerous applications. While the methods are useful for rhodium oxide deposition onto any surface, the methods have particular importance for rhodium oxide films formed on surfaces used in integrated circuits. For example, rhodium oxide films with good conformality may be formed according to the present invention onto borophosphosilicate (BPSG), silicon, polysilica glass (PSG), titanium, oxides, polysilicon or silicides, among others.

The invention is further explained with reference to the formation of a rhodium oxide electrode, for example an upper capacitor plate or upper electrode, of a metal-insulator-metal (MIM) capacitor. Films deposited in accordance with the present invention behave as excellent diffusion barriers and thus are particularly advantageous for such applications, because an electrode layer must act as an effective barrier to oxygen and silicon diffusion if it is to function properly as an electrode. Oxidation of silicon underlying the electrode would result in decreased capacitance, thereby degrading the capacitor.

Although the present invention will be described below with reference to a metal-insulator-metal (MIM) capacitor (FIGS. 3 and 4) having an upper capacitor plate 77 (FIG. 4) formed of rhodium oxide deposited by low temperature ALD, it must be understood that the present invention is not limited to MIM capacitors having a rhodium oxide upper capacitor plate. The present invention also covers other capacitor structures, such as, for example, conventional capacitors or metal-insulator-semiconductor (MIS) capacitors used in the fabrication of various IC memory cells. Moreover, it must be understood that as an alternative to rhodium oxide, alloys of rhodium oxide with other metals, such as Pt as described above, may be used in accordance with the invention, as long as one or both of the capacitor plates are formed of rhodium oxide or such alloy deposited by the methods described herein.

Figure 3:
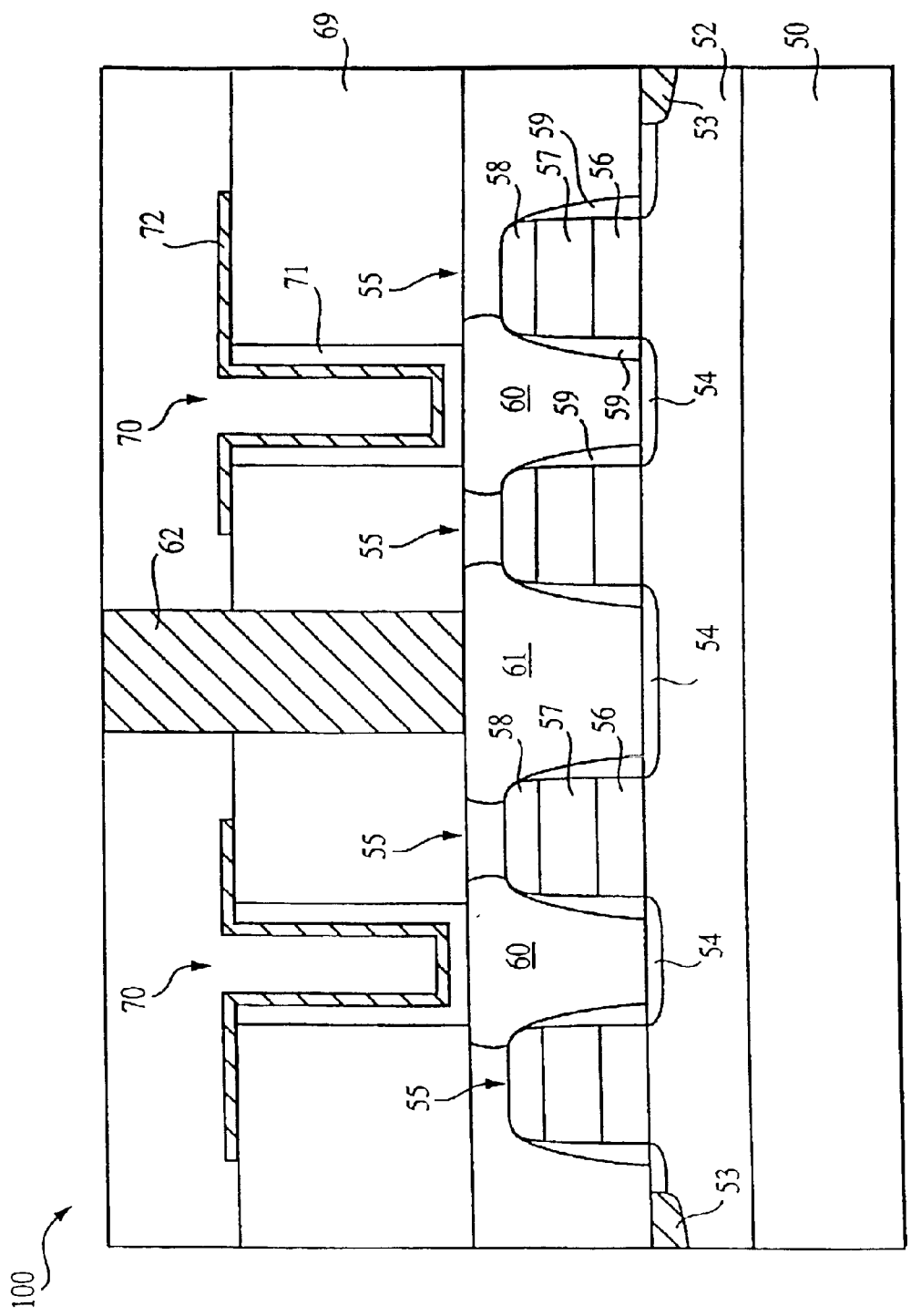
FIG. 3 illustrates a schematic cross-sectional view of a DRAM device on which an upper capacitor rhodium oxide plate would be formed according to a method of the present invention.

Referring to the drawings, FIG. 3 shows a portion 100 of a conventional DRAM memory at an intermediate stage of fabrication. A pair of memory cells having respective access transistors are formed on a substrate 50 having a doped well 52, which is typically doped to a predetermined conductivity, e.g. P-type or N-type depending on whether NMOS or PMOS transistors will be formed. The structure further includes field oxide regions 53, conventional doped active areas 54, and a pair of gate stacks 55, all formed according to well-known semiconductor processing techniques. The gate stacks 55 include an oxide layer 56, a conductive gate layer 57, spacers 59 formed of an oxide or a nitride, and a cap 58 which can be formed of an oxide, an oxide/nitride, or a nitride. The conductive gate layer 57 could be formed, for example, of a layer of doped polysilicon, or a multi-layer structure of polysilicon/$WSi_x$, polysilicon/$WN_x$/W or polysilicon/$TiSi_2$.

Further illustrated in FIG. 3 are two MIM capacitors 70, at an intermediate stage of fabrication and formed in an insulating layer 69, which are connected to active areas 54 by two respective conductive plugs 60. The DRAM memory cells also include a bit line contact 62, which is further connected to the common active area 54 of the access transistors by another conductive plug 61. The access transistors respectively write charge into and read charge from capacitors 70, to and from the bit line contact 62.

The processing steps for the fabrication of the MIM capacitor 70 (FIG. 3) provided in the insulating layer 69 include a first-level metallization 71, a dielectric film 72 deposition, and a second-level metallization. For example, FIG. 3 illustrates the MIM capacitor 70 after formation of the dielectric film 72. As such, a lower capacitor plate 71, also called a bottom or lower electrode, has already been formed during the first-level metallization. The material for the lower capacitor plate 71 is typically selected from the group of metals, or metal compositions and alloys, including but not limited to osmium (Os), platinum (Pt), rhodium (Rh), ruthenium (Ru), palladium (Pd), iridium (Ir), and their alloys.

Following the first-level deposition, the first level metallization is removed from the top surface regions typically by resist coat and CMP or dry etch. A high dielectric film 72 (FIG. 3) is formed over the lower capacitor plate 71. The most common high dielectric material used in MIM capacitors is tantalum oxide ($Ta_2O_5$), but other materials such as strontium titanate ($SrTiO_3$), alumina ($Al_2O_3$), barium strontium titanate (BaSrTiO$_3$), or zirconium oxide (ZrO$_2$) may also be used. Further, perovskite oxide dielectric films of the paraelectric type, such as lead titanate (PbTiO$_3$) or lead zirconite (PbZrO$_3$), are also good candidates for high dielectric film materials even if their dielectric constant is slightly lower than that of the above mentioned dielectrics. As is known in the art, the thickness of the high dielectric film 72 determines the capacitance per unit area of the MIM capacitor 70.

After the formation of the dielectric film 72 (FIG. 3), a second-level metallization is performed during which a rhodium oxide film 77 (FIG. 4) is formed by the low temperature ALD method described in detail above, to complete the formation of the MIM capacitor 70. Thus, the substrate 50 is introduced in the reactor chamber 10 of the apparatus of FIG. 2 so that a first reactive gas precursor 23 (FIG. 2) of an organic rhodium metal group precursor is pulsed over the substrate 50. According to the present invention, the first reactive gas precursor 23 (FIG. 2) of an organic rhodium group metal precursor may be, for example, any suitable organic compound with formula Ly[Rh]Yz, which allows rhodium to deposit from the gas onto the surface of the semiconductor substrate 50 and having at least one rhodium source compound selected from the group consisting of compounds of the formula (1) outlined above. In a preferred embodiment, vapors of dicarbonyl cyclopentadienyl rhodium [CpRh(CO$_2$)] are used as the first pulse of precursor 23 at a temperature of about 100° C. and for about 5 seconds. The surface of the substrate 50 is dosed long enough to ensure saturation and to form an organ-rhodium monolayer that is saturated.

After any of the remaining unreacted [CpRh(CO$_2$)] is completely exhausted through the exhaust inlet 18 (FIG. 2), a first purge gas 36 is then introduced into the reactor chamber 10 through the inlet 26. In an exemplary embodiment, the first purge gas 36 is helium which is introduced into the reactor chamber 10 after the complete exhaustion of the unreacted [CpRh(CO$_2$)] and for a purge duration of about 0.1 second to about 10 seconds. The helium is fed into the reactor chamber 10 at a rate of about 50 sccm.

Figure 4:
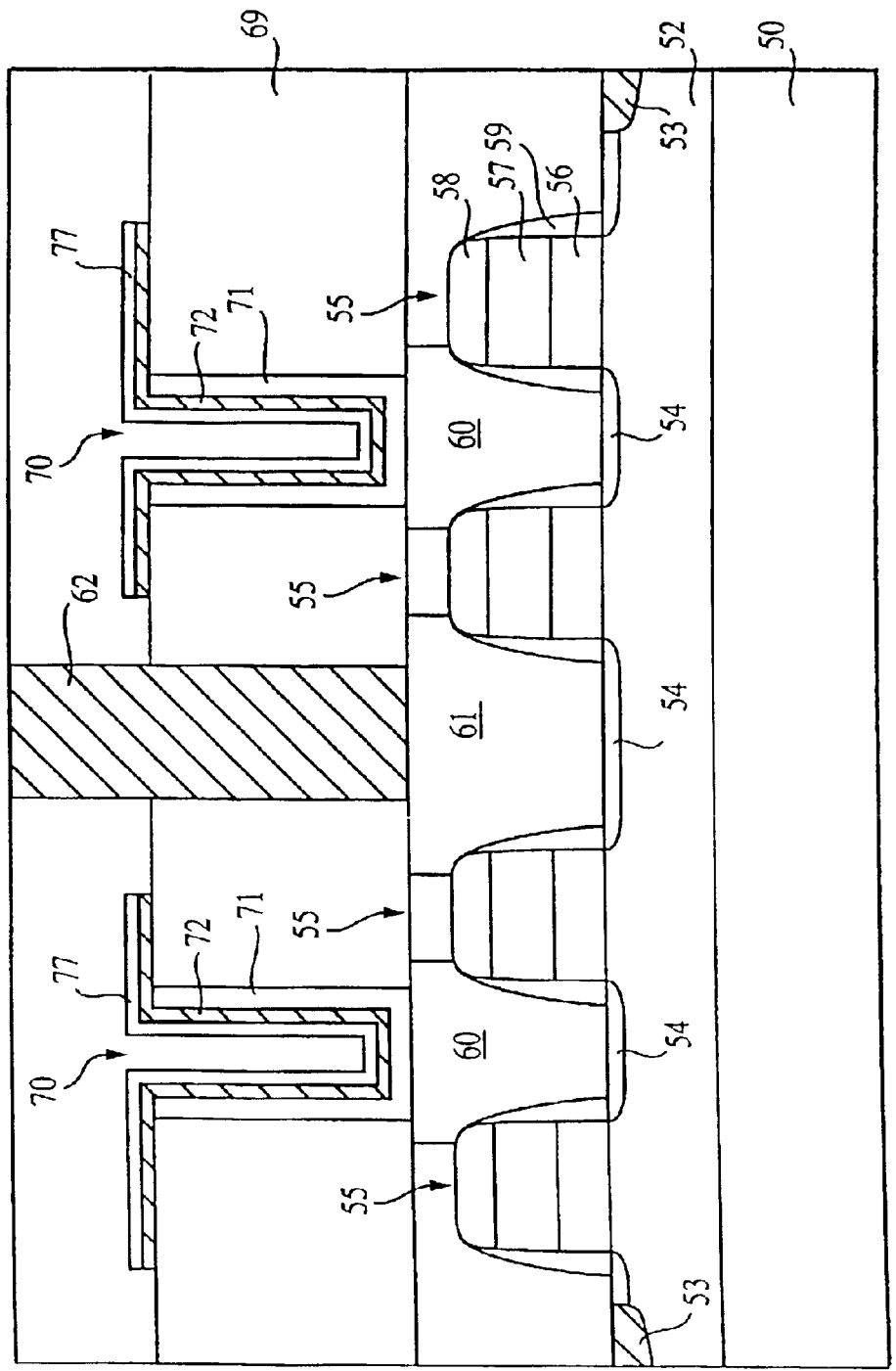
FIG. 4 illustrates a schematic cross-sectional view of the DRAM device of FIG. 3 at a stage of processing subsequent to that shown in FIG. 3.

The semiconductor 50 is then exposed to a second reactive gas precursor 25, shown in FIG. 2. The second reactive gas precursor 25 is supplied into the reactor chamber 10 through the reactive gas inlet 16*a* and also flows at a right angle onto the semiconductor 50 and the organo-rhodium monolayer. In an exemplary embodiment, the second reactive gas precursor 25 is ozone (O$_3$) which is fed into the reactor chamber 10 at a rate of about 50 sccm, and for a duration of about 1 second. Any remaining reactive ozone in the reactive chamber 10 is exhausted through the exhaust inlet 18. An intermediate pulse of a second purge gas 37 is then introduced into the reactor chamber 10 through the inlet 26. In a preferred embodiment, the second purge gas 37 is helium which is introduced into the reactor chamber 10 after about 1 second following the complete exhaustion of the unreacted ozone and for a purge duration of about 0.1 second to about 10 seconds. The helium is fed into the reactor chamber 10 at a rate of about 50 sccm. The cycle is repeated until a rhodium oxide film 77 is formed to a desired thickness as an upper capacitor plate or upper electrode, shown in FIG. 4. Although FIG. 4 shows the rhodium oxide film 77 as a patterned upper capacitor plate, those skilled in the art will realize that the rhodium oxide film formed by the ALD process of the present invention is initially formed as a blanket-deposited layer over the dielectric film 72 and then both the rhodium oxide layer and the dielectric film 72 are patterned and etched according to known methods of the art to obtain the capacitor structure of FIG. 4.

A film in which Pt or other suitable metal is alloyed with rhodium oxide can also be formed in accordance with the present invention, as described above. Films formed in accordance with the present invention are highly conductive, oxidation resistant films which have excellent conformality and act as superior barrier layers.

EXAMPLE 1

Figure 5:
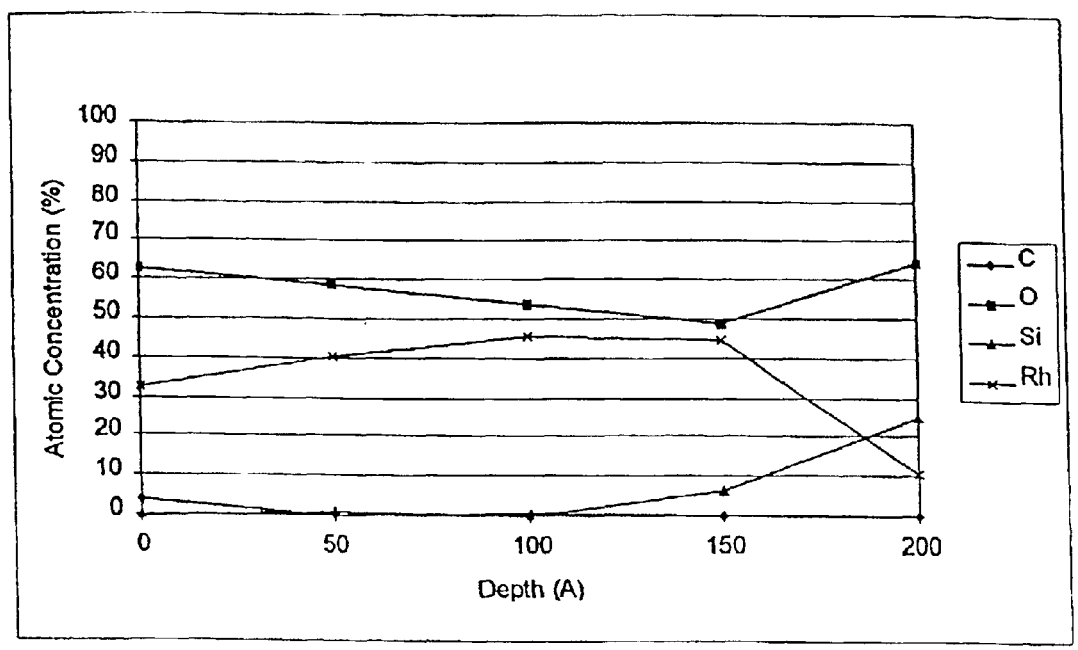
FIG. 5 illustrates an XPS profile of a rhodium oxide film deposited in accordance with the present invention.

A clean low carbon RhO$_2$ film was deposited by an ALD process in accordance with the present invention using the precursor (C$_5$H$_5$)Rh(CO)$_2$ and using ozone (O$_3$) as the second precursor or reaction gas. FIG. 5 illustrates an XPS depth profile of the deposited RhO$_2$ film. As deposited, the film had a sheet resistance of 1780 ohm/sq and after annealing in O$_2$ at 700° C. for 1 minute, the resistance dropped to 650 ohm/sq. Estimating the film thickness from the profile depth this would suggest a resistivity of about 1140 microohm×cm after the O$_2$ anneal.

EXAMPLE 2

Figure 6:
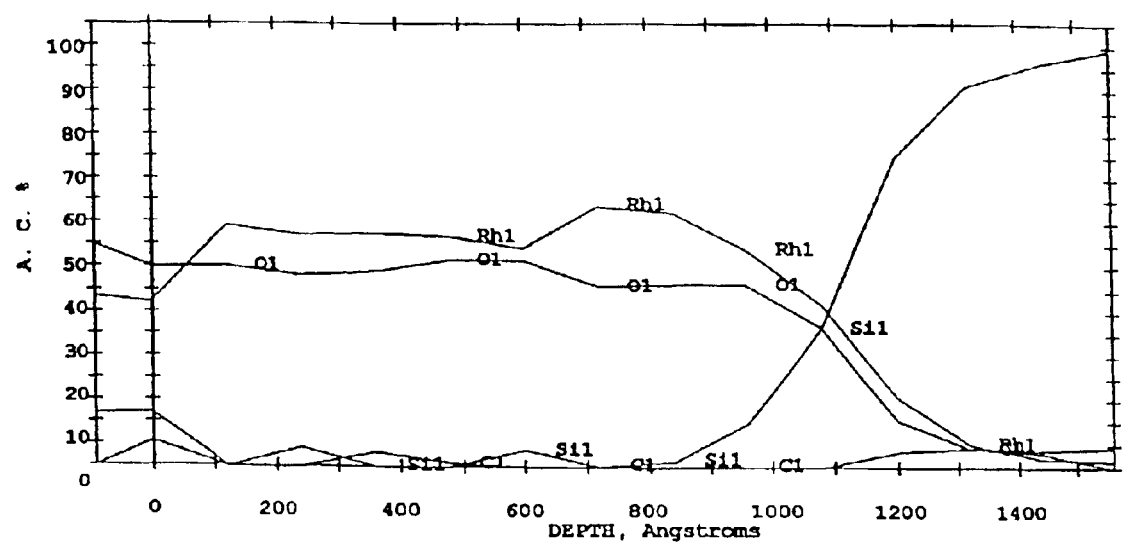
FIG. 6 illustrates an XPS profile of a second rhodium oxide film deposited in accordance with the present invention.
Figure 7:
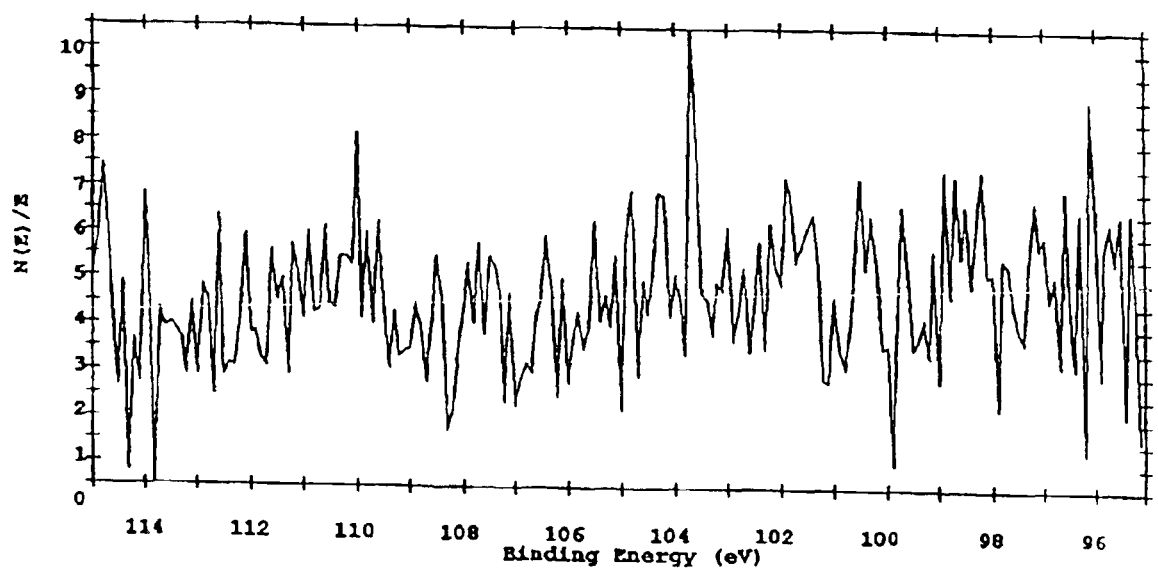
FIG. 7 illustrates the XPS photoelectron spectra of the film referred to in FIG. 6 in the region of the Si 2 p peak.

FIG. 6 shows an XPS depth profile of a second RhO$_2$ film, produced by converting Rh metal to the conducting oxide, after annealing in oxygen at 850° C. for 30 seconds. FIG. 7 shows the XPS photoelectron spectra in the region of the Si 2 p peak. This figure indicates that there is no Si present at the surface of the film, and thus confirms that an RhO$_2$ oxide film formed in accordance with the present invention behaves as an excellent Si diffusion barrier.

Although the invention has been described with reference to the formation of an upper rhodium plate of an MIM capacitor, the invention is not limited to the above embodiments. Thus, the invention contemplates the formation of high quality rhodium oxide films with good conformality that can be used in a variety of IC structures, for example as seed layers for electroplating processes, as fuse elements or as bond pads, among many others.

Figure 8:
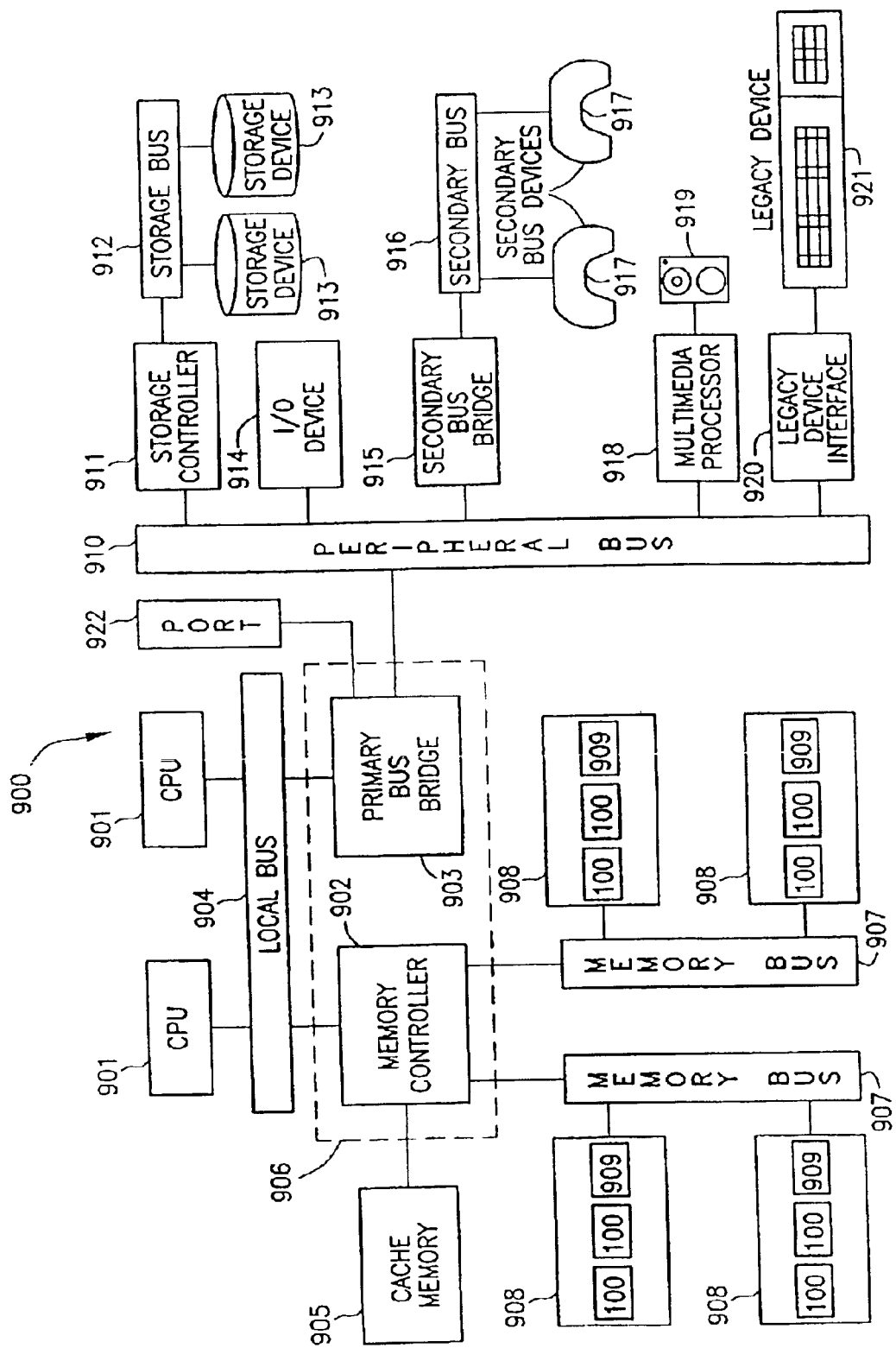
FIG. 8 illustrates a processor system having a memory device which includes a film layer formed in accordance with the present invention.

The MIM capacitor 70 of FIG. 4 including a rhodium oxide film (or alloy thereof) 77 formed according to a method of the present invention could further be part of a memory device of a typical processor based system. FIG. 8 illustrates an exemplary processing system 900 which may utilize a memory device 100 having a rhodium oxide film of the present invention. The processing system 900 includes one or more processors 901 coupled to a local bus 904. A memory controller 902 and a primary bus bridge 903 are also coupled the local bus 904. The processing system 900 may include multiple memory controllers 902 and/or multiple primary bus bridges 903. The memory controller 902 and the primary bus bridge 903 may be integrated as a single device 906.

The memory controller 902 is also coupled to one or more memory buses 907. Each memory bus accepts memory components 908 which include at least one MRAM memory device 100 incorporating rhodium oxide films described above with reference to FIGS. 1–7. The memory components 908 may be a memory card or a memory module. Examples of memory modules include single inline memory modules (SIMMs) and dual inline memory modules (DIMMs). The memory components 908 may include one or more additional devices 909. For example, in a SIMM or DIMM, the additional device 909 might be a configuration memory, such as a serial presence detect (SPD) memory. The memory controller 902 may also be coupled to a cache memory 905. The cache memory 905 may be the only cache memory in the processing system. Alternatively, other devices, for example, processors 901 may also include cache memories, which may form a cache hierarchy with cache memory 905. If the processing system 900 include peripherals or controllers which are bus masters or which support direct memory access (DMA), the memory controller 902 may implement a cache coherency protocol. If the memory controller 902 is coupled to a plurality of memory buses 907, each memory bus 907 may be operated in parallel, or different address ranges may be mapped to different memory buses 907.

The primary bus bridge 903 is coupled to at least one peripheral bus 910. Various devices, such as peripherals or additional bus bridges may be coupled to the peripheral bus 910. These devices may include a storage controller 911, an miscellaneous I/O device 914, a secondary bus bridge 915, a multimedia processor 918, and an legacy device interface 920. The primary bus bridge 903 may also coupled to one or more special purpose high speed ports 922. In a personal computer, for example, the special purpose port might be the Accelerated Graphics Port (AGP), used to couple a high performance video card to the processing system 900.

The storage controller 911 couples one or more storage devices 913, via a storage bus 912, to the peripheral bus 910. For example, the storage controller 911 may be a SCSI controller and storage devices 913 may be SCSI discs. The I/O device 914 may be any sort of peripheral. For example, the I/O device 914 may be an local area network interface, such as an Ethernet card. The secondary bus bridge may be used to interface additional devices via another bus to the processing system. For example, the secondary bus bridge may be an universal serial port (USB) controller used to couple USB devices 917 via to the processing system 900. The multimedia processor 918 may be a sound card, a video capture card, or any other type of media interface, which may also be coupled to one additional devices such as speakers 919. The legacy device interface 920 is used to couple legacy devices, for example, older styled keyboards and mice, to the processing system 900.

The processing system 900 illustrated in FIG. 8 is only one exemplary processing system with which the invention may be used. While FIG. 8 illustrates a processing architecture especially suitable for a general purpose computer, such as a personal computer or a workstation, it should be recognized that well known modifications can be made to configure the processing system 900 to become more suitable for use in a variety of applications. For example, many electronic devices which require processing may be implemented using a simpler architecture which relies on a CPU 901 coupled to memory components 908 and/or memory devices 100. These electronic devices may include, but are not limited to audio/video processors and recorders, gaming consoles, digital television sets, wired or wireless telephones, navigation devices (including system based on the global positioning system (GPS) and/or inertial navigation), and digital cameras and/or recorders. The modifications may include, for example, elimination of unnecessary components, addition of specialized devices or circuits, and/or integration of a plurality of devices.

The above description, examples, and accompanying drawings are only illustrative of exemplary embodiments, which can achieve the features and advantages of the present invention. It is not intended that the invention be limited to the embodiments shown and described in detail herein. The invention can be modified to incorporate any number of variations, alterations, substitutions or equivalent arrangements not heretofore described, but which are commensurate with the spirit and scope of the invention. The invention is only limited by the scope of the following claims.

What is claimed as new and desired to be protected by Letters Patent of the United States is:

1. A method of conducting atomic layer deposition of a rhodium oxide layer on a substrate, comprising:

providing a deposition apparatus comprising a reactor chamber having a deposition region;

positioning said substrate on said deposition region;

introducing an organo rhodium group metal precursor into said reactor chamber under conditions permitting the formation of an organo rhodium monolayer on said substrate; and introducing a reaction gas into said reactor chamber, such that said organo rhodium monolayer is oxidized to a conductive rhodium oxide layer on said substrate.

2. The method of claim 1, wherein said organo rhodium group metal precursor comprises an organic rhodium group metal precursor having the formula Ly[Rh]Yz, wherein L is independently selected from the group consisting of neutral and anionic ligands; y is one of $\{1, 2, 3, 4\}$; Y is independently a pi-orbital bonding ligand selected from the group consisting of CO, NO, CN, CS, $N_2$, $PX_3$, $PR_3$, $P(OR)_3$, $AsX_3$, $AsR_3$, $As(OR)_3$, $SbX_3$, $SbR_3$, $Sb(OR)_3$, $NH_xR_{3-x}$, CNR, and RCN, wherein R is an organic group, X is a halide and x is one of $\{0, 1, 2, 3\}$; and z is one of $\{0, 1, 2, 3, 4\}$.

3. The method of claim 1, wherein said reaction gas is ozone.

4. The method of claim 2, wherein said organo rhodium group metal precursor is dicarbonyl cyclopentadienyl rhodium.

5. The method of claim 1, wherein said atomic layer deposition is performed at a temperature of about 100° C. to about 200° C.

6. The method of claim 5, wherein said atomic layer deposition is performed at a temperature of about 100° C. to about 150° C.

7. The method of claim 1, wherein said organo rhodium group metal precursor is introduced into said reactor chamber at a rate of about 0.1 to about 500 sccm.

8. The method of claim 7, wherein said organo rhodium group metal precursor is introduced into said reactor chamber at a rate of about 0.1 to about 5 sccm.

9. The method of claim 1, wherein said reaction gas is introduced into said reactor chamber at a rate of about 1 to about 500 sccm.

10. The method of claim 9, wherein said reaction gas is introduced into said reactor chamber at a rate of about 10 to about 200 sccm.

11. The method of claim 1, further comprising introducing a first purge gas into said reactor chamber after said introducing a rhodium group metal precursor and before said introducing a reaction gas.

12. The method of claim 11, wherein said first purge gas is selected from the group consisting of helium, argon and nitrogen.

13. The method of claim 11 further comprising introducing a second purge gas into said reactor chamber after said introducing a reaction gas.

14. The method of claim 13, wherein said second purge gas is selected from the group consisting of helium, argon and nitrogen.

15. The method of claim 1, wherein said rhodium oxide layer has a resistivity of less than about 100 $\mu\Omega$cm.

16. A method of conducting atomic layer deposition of a rhodium oxide on an integrated circuit material layer, comprising:

provided a deposition apparatus comprising a reactor chamber having a deposition region;

positioning said material layer in said deposition region;

introducing an organo rhodium group metal precursor into said reactor chamber under conditions permitting the formation of an organo rhodium monolayer on said material layer; and introducing a reaction gas into said reactor chamber, such that said organo rhodium monolayer is oxidized to a conductive rhodium oxide layer.

17. The method of claim 16, wherein said rhodium group metal precursor comprises an organic rhodium group metal precursor having the formula Ly[Rh]Yz, wherein L is independently selected from the group consisting of neutral and anionic ligands; y is one of $\{1, 2, 3, 4\}$; Y is independently a pi-orbital bonding ligand selected from the group consisting of CO, NO, CN, CS, $N_2$, $PX_3$, $PR_3$, $P(OR)_3$, $AsX_3$, $AsR_3$, $As(OR)_3$, $SbX_3$, $SbR_3$, $Sb(OR)_3$, $NH_xR_{3-x}$, CNR, and RCN, wherein R is an organic group, X is a halide and x is one of $\{0, 1, 2, 3\}$; and z is one of $\{0, 1, 2, 3, 4\}$.

18. The method of claim 16, wherein said reaction gas is ozone.

19. The method of claim 17, wherein said rhodium group metal precursor is dicarbonyl cyclopentadienyl rhodium.

20. The method of claim 16, wherein said atomic layer deposition is performed at a temperature of about 100° C. to about 200° C.

21. The method of claim 20, wherein said atomic layer deposition is performed at a temperature of about 100° C. to about 150° C.

22. The method of claim 16, wherein said rhodium group metal precursor is introduced into said reactor chamber at a rate of about 0.1 to about 500 sccm.

23. The method of claim 22, wherein said rhodium group metal precursor is introduced into said reactor chamber at a rate of about 0.1 to about 5 sccm.

24. The method of claim 16, wherein said reaction gas is introduced into said reactor chamber at a rate of about 1 to about 500 sccm.

25. The method of claim 24, wherein said reaction gas is introduced into said reactor chamber at a rate of about 10 to about 200 sccm.

26. The method of claim 16, further comprising introducing a first purge gas into said reactor chamber after said introducing a rhodium group metal precursor and before said introducing a reaction gas.

27. The method of claim 26, wherein said first purge gas is selected from the group consisting of helium, argon and nitrogen.

28. The method of claim 26 further comprising introducing a second purge gas into said reactor chamber after said introducing a reaction gas.

29. The method of claim 28, wherein said second purge gas is selected from the group consisting of helium, argon and nitrogen.

30. The method of claim 16, wherein said rhodium oxide layer has a resistivity of less than about 100 $\mu\Omega$cm.

31. A method of conducting atomic layer deposition of an alloy layer of rhodium oxide and a metal selected from the group consisting of Pt, Os, Pd, and Ir on a substrate, said method comprising:

providing a deposition apparatus comprising a reactor chamber having a deposition region;

positioning said substrate on said deposition region;

introducing a rhodium group metal precursor into said reactor chamber under conditions permitting the formation of a rhodium monolayer on said substrate;

introducing a first reaction gas into said reactor chamber, such that said rhodium monolayer is oxidized to a conductive rhodium oxide layer;

introducing a precursor compound comprising a metal selected from the group consisting of Pt, Os, Pd, and Ir;

introducing a second reaction gas into said reactor chamber, wherein said introduction causes removal of organic components from the precursor compound, yielding a conductive alloy layer of rhodium oxide and a metal selected from the group consisting of Pt, Os, Pd, and Ir on said substrate.

32. The method of claim 31, wherein said rhodium group metal precursor comprises an organic rhodium group metal precursor having the formula Ly[Rh]Yz, wherein L is independently selected from the group consisting of neutral and anionic ligands; y is one of $\{1, 2, 3, 4\}$; Y is independently a pi-orbital bonding ligand selected from the group consisting of CO, NO, CN, CS, $N_2$, $PX_3$, $PR_3$, $P(OR)_3$, $AsX_3$, $AsR_3$, $As(OR)_3$, $SbX_3$, $SbR_3$, $Sb(OR)_3$, $NH_xR_{3-x}$, CNR, and RCN, wherein R is an organic group, X is a halide and x is one of $\{0, 1, 2, 3\}$; and z is one of $\{0, 1, 2, 3, 4\}$.

33. The method of claim 31, wherein said first reaction gas is ozone.

34. The method of claim 31, wherein said second reaction gas is selected from the group consisting of ozone and oxygen.

35. The method of claim 32, wherein said rhodium group metal precursor is dicarbonyl cyclopentadienyl rhodium.

36. The method of claim 31, wherein said atomic layer deposition is performed at a temperature of about 100° C. to about 200° C.

37. The method of claim 36, wherein said atomic layer deposition is performed at a temperature of about 100° C. to about 150° C.

38. The method of claim 31, wherein said rhodium group metal precursor is introduced into said reactor chamber at a rate of about 0.1 to about 500 sccm.

39. The method of claim 38, wherein said rhodium group metal precursor is introduced into said reactor chamber at a rate of about 0.1 to about 5 sccm.

40. The method of claim 31, wherein said reaction gas is introduced into said reactor chamber at a rate of about 1 to about 500 sccm.

41. The method of claim 40, wherein said reaction gas is introduced into said reactor chamber at a rate of about 10 to about 200 sccm.

42. The method of claim 31, further comprising introducing a first purge gas into said reactor chamber after said introducing a rhodium group metal precursor and before said introducing a first reaction gas.

43. The method of claim 42, wherein said first purge gas is selected from the group consisting of helium, argon and nitrogen.

44. The method of claim 42 further comprising introducing a second purge gas into said reactor chamber after said introducing a first reaction gas.

45. The method of claim 44, wherein said second purge gas is selected from the group consisting of helium, argon and nitrogen.

46. The method of claim 44, further comprising introducing a third purge gas into said reactor chamber after said introducing a precursor compound comprising a metal selected from the group consisting of Pt, Os, Pd, and Ir.

47. The method of claim 46, wherein said third purge gas is selected from the group consisting of helium, argon and nitrogen.

48. The method of claim 46, further comprising introducing a fourth purge gas into said reactor chamber after said introducing a second reaction gas.

49. The method of claim 48, wherein said fourth purge gas is selected from the group consisting of helium, argon and nitrogen.

50. A method of conducting atomic layer deposition of an alloy layer of rhodium oxide and a metal selected from the group consisting of Pt, Os, Pd, and Ir on an integrated circuit material layer, said method comprising:

provided a deposition apparatus comprising a reactor chamber having a deposition region;

positioning said integrated circuit material layer on said deposition region;

introducing a rhodium group metal precursor into said reactor chamber under conditions permitting the formation of a rhodium monolayer on said material layer;

introducing a first reaction gas into said reactor chamber, such that said rhodium monolayer is oxidized to a rhodium oxide layer;

introducing a precursor compound comprising a metal selected from the group consisting of Pt, Os, Pd, and Ir;

introducing a second reaction gas into said reactor chamber, wherein said introduction causes removal of organic components from the precursor compound, yielding a conductive alloy layer of rhodium oxide and a metal selected from the group consisting of Pt, Os, Pd, and Ir on said material layer.

51. The method of claim 50, wherein said rhodium group metal precursor comprises an organic rhodium group metal precursor having the formula Ly[Rh]Yz, wherein L is independently selected from the group consisting of neutral and anionic ligands; y is one of {1, 2, 3, 4}; Y is independently a pi-orbital bonding ligand selected from the group consisting of CO, NO, CN, CS, $N_2$, $PX_3$, $PR_3$, $P(OR)_3$, $AsX_3$, $AsR_3$, $As(OR)_3$, $SbX_3$, $SbR_3$, $Sb(OR)_3$, $NH_xR_{3-x}$, CNR, and RCN, wherein R is an organic group, X is a halide and x is one of {0, 1, 2, 3}; and z is one of {0, 1, 2, 3, 4}.

52. The method of claim 50, wherein said first reaction gas is ozone.

53. The method of claim 50, wherein said second reaction gas is selected from the group consisting of ozone and oxygen.

54. The method of claim 51, wherein said rhodium group metal precursor is dicarbonyl cyclopentadienyl rhodium.

55. The method of claim 50, wherein said atomic layer deposition is performed at a temperature of about 100° C. to about 200° C.

56. The method of claim 55, wherein said atomic layer deposition is performed at a temperature of about 100° C. to about 150° C.

57. The method of claim 50, wherein said rhodium group metal precursor is introduced into said reactor chamber at a rate of about 0.1 to about 500 sccm.

58. The method of claim 57, wherein said rhodium group metal precursor is introduced into said reactor chamber at a rate of about 0.1 to about 5 sccm.

59. The method of claim 50, wherein said reaction gas is introduced into said reactor chamber at a rate of about 1 to about 500 sccm.

60. The method of claim 59, wherein said reaction gas is introduced into said reactor chamber at a rate of about 10 to about 200 sccm.

61. The method of claim 50, further comprising introducing a first purge gas into said reactor chamber after said introducing a rhodium group metal precursor and before said introducing a first reaction gas.

62. The method of claim 61, wherein said first purge gas is selected from the group consisting of helium, argon and nitrogen.

63. The method of claim 61 further comprising introducing a second purge gas into said reactor chamber after said introducing a first reaction gas.

64. The method of claim 63, wherein said second purge gas is selected from the group consisting of helium, argon and nitrogen.

65. The method of claim 63, further comprising introducing a third purge gas into said reactor chamber after said introducing a precursor compound comprising a metal selected from the group consisting of Pt, Os, Pd, and Ir.

66. The method of claim 65, wherein said third purge gas is selected from the group consisting of helium, argon and nitrogen.

67. The method of claim 65, further comprising introducing a fourth purge gas into said reactor chamber after said introducing a second reaction gas.

68. The method of claim 67, wherein said fourth purge gas is selected from the group consisting of helium, argon and nitrogen.

69. A method of forming a capacitor, said method comprising:

forming a first and second electrode; and forming a dielectric layer between said first and second electrode, wherein at least one of said first and second electrode is formed by performing atomic layer deposition of a conductive rhodium oxide layer.

70. A method of forming a capacitor, said method comprising:

forming a first and second electrode; and forming a dielectric layer between said first and second electrode, wherein at least one of said first and second electrode is formed by performing atomic layer deposition of a conductive alloy layer of rhodium oxide and a metal selected from the group consisting of Pt, Os, Pd, and Ir.

71. A capacitor comprising:

a first electrode;

a second electrode; and a dielectric positioned between said first electrode and said second electrode, wherein at least one of said first and second electrode comprises a continuous ALD deposited conductive rhodium oxide film layer.

72. A capacitor comprising:

a first electrode;

a second electrode; and a dielectric positioned between said first electrode and said second electrode; wherein at least one of said first and second electrode comprises a continuous ALD deposited conductive film comprising an alloy of rhodium oxide and a metal selected from the group consisting of Pt, Os, Pd, and Ir.

73. A processor system comprising:

a processor; and a memory device coupled to exchange data with said processor, said memory device comprising:

at least one continuous ALD deposited conductive rhodium oxide film layer.

74. A processor system comprising:

a processor; and a memory device coupled to exchange data with said processor, said memory device comprising:

at least one continuous ALD deposited conductive film layer comprising an alloy of rhodium oxide and a metal selected from the group consisting of Pt, Os, Pd, and Ir.

75. A method of conducting atomic layer deposition of a rhodium oxide layer on a substrate, comprising:

providing a deposition apparatus comprising a reactor chamber having a deposition region;

positioning said substrate on said deposition region;

introducing an organo rhodium group metal precursor into said reactor chamber under conditions permitting the formation of an organo rhodium monolayer on said substrate; and introducing a reaction gas into said reactor chamber, such that said organo rhodium monolayer is fully oxidized to a conductive rhodium oxide layer on said substrate.

76. A method of conducting atomic layer deposition of a rhodium oxide on an integrated circuit material layer, comprising:

providing a deposition apparatus comprising a reactor chamber having a deposition region;

positioning said material layer in said deposition region;

introducing an organo rhodium group metal precursor into said reactor chamber under conditions permitting the formation of an organo rhodium monolayer on said material layer; and introducing a reaction gas into said reactor chamber, such that said organo rhodium monolayer is fully oxidized to a conductive rhodium oxide layer.

77. A method of conducting atomic layer deposition of an alloy layer of rhodium oxide and a metal selected from the group consisting of Pt, Os, Pd, and Ir on a substrate, said method comprising:

providing a deposition apparatus comprising a reactor chamber having a deposition region;

positioning said substrate on said deposition region;

introducing a rhodium group metal precursor into said reactor chamber under conditions permitting the formation of a rhodium monolayer on said substrate;

introducing a first reaction gas into said reactor chamber, such that said rhodium monolayer is fully oxidized to a conductive rhodium oxide layer;

introducing a precursor compound comprising a metal selected from the group consisting of Pt, Os, Pd, and Ir; and introducing a second reaction gas into said reactor chamber, wherein said introduction causes removal of organic components from the precursor compound, yielding a conductive alloy layer of fully oxidized rhodium oxide and a metal selected from the group consisting of Pt, Os, Pd, and Ir on said substrate.

78. A method of conducting atomic layer deposition of an alloy layer of rhodium oxide and a metal selected from the group consisting of Pt, Os, Pd, and Ir on an integrated circuit material layer, said method comprising:

providing a deposition apparatus comprising a reactor chamber having a deposition region;

positioning said integrated circuit material layer on said deposition region;

introducing a rhodium group metal precursor into said reactor chamber under conditions permitting the formation of a rhodium monolayer on said material layer;

introducing a first reaction gas into said reactor chamber, such that said rhodium monolayer is fully oxidized to a rhodium oxide layer;

introducing a precursor compound comprising a metal selected from the group consisting of Pt, Os, Pd, and Ir; and introducing a second reaction gas into said reactor chamber, wherein said introduction causes removal of organic components from the precursor compound, yielding a conductive alloy layer of fully oxidized rhodium oxide and a metal selected from the group consisting of Pt, Os, Pd, and Ir on said material layer.

79. A method of forming a capacitor, said method comprising:

forming a first and second electrode; and forming a dielectric layer between said first and second electrode, wherein at least one of said first and second electrode is formed by performing atomic layer deposition of a fully oxidized, conductive rhodium oxide layer.

80. A method of forming a capacitor, said method comprising:

forming a first and second electrode; and forming a dielectric layer between said first and second electrode, wherein at least one of said first and second electrode is formed by performing atomic layer deposition of a conductive alloy layer of fully oxidized rhodium oxide and a metal selected from the group consisting of Pt, Os, Pd, and Ir.

* * * * *